United States Patent [19]

Muellenheim et al.

[11] Patent Number: 4,543,554
[45] Date of Patent: Sep. 24, 1985

[54] SYSTEM FOR THE ELIMINATION OF RADIO INTERFERENCE AND METHOD FOR ITS MANUFACTURE

[75] Inventors: Thomas Muellenheim, Kahl; Hans-Joachim Nilius, Seligenstadt, both of Fed. Rep. of Germany

[73] Assignee: Vacuumschmelze GmbH, Fed. Rep. of Germany

[21] Appl. No.: 342,850

[22] Filed: Jan. 26, 1982

[30] Foreign Application Priority Data

Feb. 7, 1981 [DE] Fed. Rep. of Germany ....... 3104270

[51] Int. Cl.$^4$ .............................................. H01F 15/02
[52] U.S. Cl. ..................................... 336/83; 336/96; 336/220; 336/229
[58] Field of Search ................... 336/83, 96, 220, 229, 336/84 M; 174/35 R, 52 PE; 361/394, 424; 264/272.14, 272.19

[56] References Cited

U.S. PATENT DOCUMENTS 3,230,488  1/1966  Jacob ............................. 336/83 X
3,390,226  6/1968  Beyerlein ...................... 174/52 PE
3,538,472  11/1970  Bell et al. ...................... 336/84 M

FOREIGN PATENT DOCUMENTS

G7037848.2  10/1970  Fed. Rep. of Germany .
1315581  12/1962  France ......................... 174/52 PE
2218634  9/1974  France ......................... 174/52 PE Primary Examiner—Reinhard J. Eisenzopf
Attorney, Agent, or Firm—Hill, Van Santen, Steadman & Simpson

[57] ABSTRACT

In a system for the elimination of radio noise, both balanced-to-ground as well as unbalanced-to-ground noise currents are employed. Attenuation is achieved by employing current-compensated noise elimination chokes whose leakage inductance is increased by a magnetic shunt. In order to simply manufacture a magnetic shunt which can be distributed well over the windings, the choke is provided in a container filled with a casting compound, and a powder consisting of a material with good magnetic conductivity is embedded in the casting compound in the proximity of the choke.

4 Claims, 3 Drawing Figures

SYSTEM FOR THE ELIMINATION OF RADIO INTERFERENCE AND METHOD FOR ITS MANUFACTURE

BACKGROUND OF THE INVENTION

The invention relates to a system for the elimination of radio interference which is disposed in a container filled with a casted insulating material. An inductor functioning as a choke is formed on a toroidal core of low-retentivity material. At least two windings permeated by line current are wound on the core and magnetically conductive material is disposed in the proximity of the choke.

An arrangement for the elimination of radio noise, and which contains a current-compensated multiple choke, is known from German Utility Model No. 70 37 848, incorporated herein by reference. There, at least two windings are applied to a toroidal core. These windings are permeated by the operating current in such manner that the magnetic effects of the operating current which flow back and forth are mutually cancelled in the toroidal core. By so doing, a high attenuation can be achieved for interference currents which are unbalanced-to-ground. This attenuation is subject to further improvement by employing capacitors disposed between the conductors and ground. Since balanced-to-ground interference currents cancel one another through their magnetic effect in the core like the operating currents, an increase of the leakage inductance of the noise suppression choke is provided for the attenuation of the balanced-to-ground currents. In order to increase this leakage inductance, the choke is disposed in a container consisting of electrically conductive material, and additional magnetically conductive parts are provided, if need be, below or in the center point of the toroidal core.

SUMMARY OF THE INVENTION

In contrast thereto, it is an object of the present invention to achieve an arrangement for the elimination of radio noise which is simpler to manufacture and permits a reduced structural volume given the same output or efficiency.

This object is inventively achieved in that powder consisting of magnetically conductive material embedded in the casting compound is situated in the container, at least in the proximity of the choke.

In the known arrangements for elimination of radio noise, a specific spacing must be observed between the additionally provided parts consisting of magnetically conductive material and the choke in order to set the leakage inductance. With the invention, by embedding the choke in powder consisting of magnetically conductive material embedded in the casting compound, the leakage inductance can be fixed by the selection of the grain size of the powder or, respectively by the mixing proportion between the powder and the insulating casting compound. This produces a significant simplification during manufacture. Moreover, due to the powder completely surrounding the choke, an effectively improved thermal conductivity towards all sides results so that a higher loadability of the choke windings is provided, given the same dimensions. It is further achieved given the inventive arrangement that the leakage flux which is being formed is distributed to a greater cross-section comprising the entire enveloping surface of the winding. By so doing, a higher current is also permissible in comparison to the known arrangement since the saturation inductance is not reached until higher operating currents because of the larger cross-section available for the leakage flux.

DESCRIPTION OF THE PREFERRED EMBODIMENTS

Figure 1:
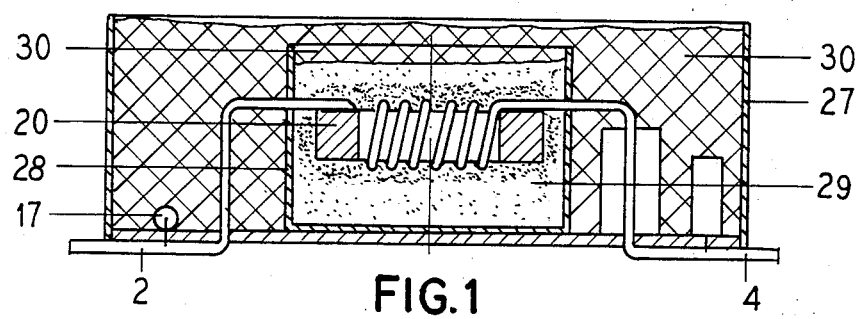
FIGS. 1 and 2 illustrate the invention side and top cross-sectional views respectively.

A system for the elimination of radio noise 1 is connected to the terminal posts 2 and 3 of an alternating current circuit, and exhibits output posts 4 and 5 which are connected to a rectifier 6. In known manner, the rectified current arrives at a chopper comprised of a capacitor 7, thyristors 8 and 9, a transformer 10 with following diodes 11 and 12, and of a smoothing element consisting of an axial choke 13 and of a shunt capacitor 14. A rectified voltage of the desired size is then present at the output posts 15 and 16 of the circuit in which the radio noise elimination system is employed.

In detail, the arrangement for the elimination of radio noise 1 consists of a discharging resistor 17 which is connected between the posts 2 and 3, of the windings 18 and 19, and of a current-compensated choke 20 with a toroidal core 21 onto which the windings 18 and 19 are wound in such manner that the inductions produced by the operating currents are compensated in the toroidal core 21. The free ends of the windings 18 and 19 are conducted via lines 22 and 23 to the output posts 4 and 5 of the arrangement for the elimination of radio noise 1. Respective capacitors 24 through 26 are situated between the lines 22 and 23 and between these lines and ground. The arrangement for the elimination of radio noise is disposed in an outside container 27 filled with a casting compound, for example casting resin. A further container 28 which only accepts the choke 20 can be situated therein.

Figure 2:
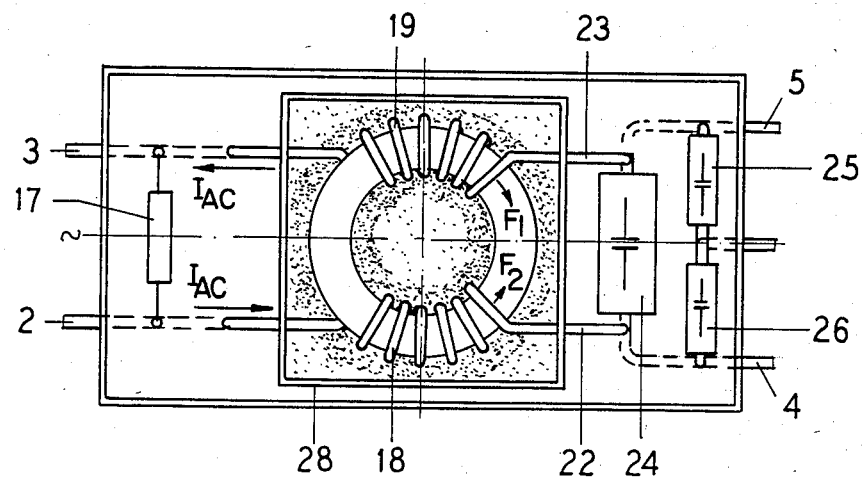
Figure 3:
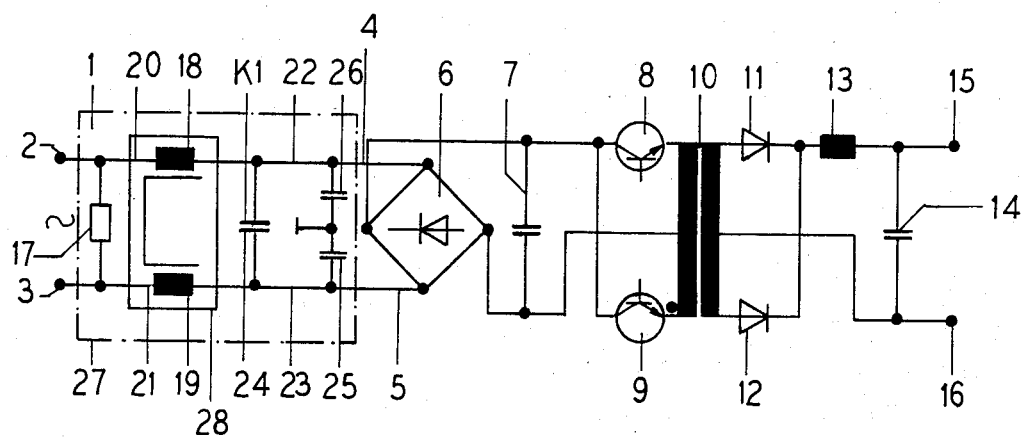
FIG. 3 is a circuit diagram of the interference elimination inventive system as employed in a power circuit.

High frequency currents and voltages which are to be isolated from the electrical network by means of the system of this invention for the elimination of radio noise, arise due to the thyristors 8 and 9 which are being rapidly switched on and off. Also, high frequency interference currents deriving from the mains are to be suppressed by the arrangement for the elimination of radio noise. In order to also sufficiently attenuate the currents which are symmetrical to ground, like the operating current, which flow between the lines 22 and 23, it is advantageous when the choke 20 within the arrangement for the elimination of radio noise exhibits a high leakage inductance without the inductance being reduced relative to the unsymmetrical or unbalance noise current. For this purpose, as shown in FIGS. 1 and 2, the choke 20 is embedded in iron powder 29 which is surrounded by the wall of the container 28 or, if embedded in casting compound, by the casting compound 30.

For manufacturing the choke with increased leakage inductance, the wound choke according to the invention is embedded in a specific amount of iron powder. Subsequently, the overall arrangement for the elimination of radio noise is filled or cast out with insulating casting compound.

In case the arrangement for the elimination of radio noise is meant to withstand higher voltages, the casting compound for the choke can, with particular advantage, be mixed in its fluid state with iron powder consisting of other low-retentivity material. This mixture can then be employed for cast filling the overall arrangement for the elimination of radio noise or only the container 28. In this instance, insulating intervals between the individual particles of the iron powder already exist in the proximity of the choke, so that under certain conditions, the insulation of the windings can also be reduced or even become superfluous.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A system for the elimination of radio noise, comprising: a choke formed of a toroidal core of low-retentivity material onto which two windings on which a line current travelling in opposite directions in the two windings may be impressed are wound; the choke being positioned in a container within a casting compound of insulating material; and a powder of magnetically conductive material embedded in the casting compound situated in the container in a proximity of and surrounding the choke in such a manner and distribution so as to establish a specific desired leakage inductance for the choke so as to attenuate interference currents which are symmetrical to ground and travelling in opposite directions like the line current by providing the specific leakage inductance.

2. A system according to claim 1 wherein the system includes parts additional to the choke, and the container with the choke and the additional parts of the system for the elimination of radio noise are located in an outer container.

3. A system according to claim 1 wherein the toroidal core is comprised of a nickel-alloy with 40 to 80% nickel, and said powder comprises an iron powder.

4. A system for the elimination of radio noise, comprising: a choke formed of a toroidal core of low-retentivity material onto which two windings spaced across from each other are wound on opposite sides of the core; a container within which the choke is positioned; an insulating casting compound surrounding the choke and positioning the choke within the container; and a powder of magnetically conductive material in the casting compound in a proximity of the choke and in a quantity and with a distribution sufficient so as to increase leakage inductance of the choke to a specific desired value so as to set the leakage inductance at a value for attenuating balanced-to-ground noise currents travelling in opposite directions like a line current in the two windings of the choke.

* * * * *